United States Patent
Coomes

(10) Patent No.: US 6,499,122 B1
(45) Date of Patent: Dec. 24, 2002

(54) ADJUSTABLE VOLTAGE BOUNDARY SCAN ADAPTER FOR EMULATION AND TEST

(75) Inventor: Joseph A. Coomes, Missouri City, TX (US)

(73) Assignee: Spectrum Digital Incorporated, Houston, TX (US)

( * ) Notice: Subject to any disclaimer, the term of this patent is extended or adjusted under 35 U.S.C. 154(b) by 0 days.

(21) Appl. No.: 09/265,652

(22) Filed: Mar. 10, 1999

(51) Int. Cl.$^7$ .............................................. G01R 31/28

(52) U.S. Cl. ...................................................... 714/724

(58) Field of Search .......................... 714/25, 30, 46, 714/727, 724; 703/23, 13, 25; 324/765

(56) References Cited

U.S. PATENT DOCUMENTS

| | | | | |
|---|---|---|---|---|
| 5,329,471 A | * | 7/1994 | Swoboda et al. | 703/23 |
| 5,519,715 A | * | 5/1996 | Hao et al. | 714/727 |
| 5,590,354 A | * | 12/1996 | Klapproth et al. | 714/30 |
| 5,828,824 A | * | 10/1998 | Swoboda | 714/25 |
| 5,999,008 A | * | 12/1999 | Currin et al. | 324/765 |

OTHER PUBLICATIONS

Spectrum Digital Incorporated, "Portable JTAG Emulator for Intel 1960* Microprocessors—SP1610 Emulator" (date not specified).
Spectrum Digital Incorporated, "Portable Scan Path Emulator for JTAG Processors—XDS510PP" (date not specified, but bears 1998 copyright date).
Spectrum Digital Incorporated, "Portable Scan Path Emulator for MPSD Processors—XDS510PP" (date not specified, but bears 1998 copyright date).
Spectrum Digital Incorporated, "Intelligent Scan Path Emulator for MPSD Processors—SP1530" (date not specified, but bears 1999 copyright date).
White Mountain DSP (Nashua, NH), "Trek–ICE Universal Ethernet Emulator" (date not specified, but bears 1998 copyright date).
White Mountain DSP (Nashua, NH), "Mountain–ICE/WS JTAG Emulator–SBus" (date not specified, but bears 1998 copyright date).
White Mountain DSP (Nashua, NH), "Summit–ICE PCI Emulator" (date not specified, but bears 1998 copyright date).
White Mountain DSP (Nashua, NH), "Mountain–ICE JTAG Emulator–PC–ISA" (dot not specified, but printed from Web site on Jul. 13, 1999).
White Mountain DSP (Nashua, NH), "Summit–510 PCI-Based Emulator" (date not specified, but printed from Web site on Jul. 13, 1999).
White Mountain DSP (Nashua, NH), "Mountain–510/LT Universal Emulator–PCMCIA" (date not specified, but printed from Web site on Jul. 13, 1999).
White Mountain DSP (Nashua, NH), "Mountain–510 Universal DSP Emulator–PC–AT/ISA" (date not specified, but printed from Web side on Jul. 13, 1999).
DSP Research, "TMS320 Emulators" (date not specified, but printed from Web site on Jul. 13, 1999).

(List continued on next page.)

*Primary Examiner*—Albert Decady
*Assistant Examiner*—Shelly A Chase
(74) *Attorney, Agent, or Firm*—Mark R. Wisner

(57) ABSTRACT

An apparatus for emulating, testing, interrogating, debugging, and programming an integrated circuit is provided. The apparatus has a boundary scan adapter in association with a host computer for accepting a control signal from the host computer, and for generating an intermediate signal for acceptance by the integrated circuit which intermediate signal is compliant with the specifications of the integrated circuit. Also, the apparatus has an interface associated with the integrated circuit for accepting the intermediate signal from the boundary scan adapter. The control signal from the host computer has a magnitude greater than the magnitude of the intermediate signal which intermediate signal is specific to and compliant with the operation of the integrated circuit.

33 Claims, 5 Drawing Sheets

OTHER PUBLICATIONS

DSP Research, Inc., "TIGER, TEM54x Emulator" (date not specified, but printed from Web site on Jul. 13, 1999).
DSP Research, Inc., "TIGER TEM50s Emulator" (date not specified, but printed from Web site on Jul. 13, 1999).
DSP Research, Inc., "TIGER TEM50 Emulator" (date not specified, but printed from Web site Jul. 13, 1999).
DSP Research, Inc., "TIGER TEM30s Emulator" (date not specified, but printed from Web site on Jul. 13, 1999).
DSP Research, Inc., "TIGER TEM30 Emulator" (date not specified, but printed from Web site on Jul. 13, 1999).
DSP Research, Inc., "TIGER TEM2xx Emulator" (date not specified, but printed from Web site on Jul. 13, 1999).
DSP Research, Inc., "TIGER TEM40 Emulator" (date not specified, but printed from Web site on Jul. 13, 1999).
Corelis, "SeanICE–BCM3310 Boundary–Scan (EJTAG) Emulator for the BCM3310 Processor" (date not specified, but printed from Web site on Jul. 13, 1999).
Corelis, PowerEM–603 Boundary–Scan (JTAG) Emulator for PowerPC™ 603 (date not specified, but printed from Web site on Jul. 13, 1999).
Corelis, PowerEM–403 Boundary–Scan (JTAG) Emulator for PowerPC™ 403 (date not specified, but printed from Web site on Jul. 13, 1999).
Corelis, NetICE–R™ LAN–based ROM Emulator (date not specified, but printed from Web site on Jul. 13, 1999).
Corelis, EMDT/960RX/HX/JX/VH Boundary–Scan (JTAG) Emulators for Intel 1960® Processor (date not specified, but printed from Web site on Jul. 13, 1999).
Innovative Integration, "Code Hammer—Hardware Assisted In–System Debugger" (date not specified, but printed from Web site on Jul. 13, 1999).
ARM, Multi–processor EmbeddedICE™ Interface Unit (date not specified, but bears 1998 copyright date).
Applied Microsystems Corporation, "CodeTAP Emulators for MIPS R3000, 4700, 4600, 4650, 5000" (date not specified, but printed from Web side on Jul. 13, 1999).
Applied Microsystems Corporation, "Applied Microsystems Supports Intel Pentium®II and Celeron® Processors with new CODETAP® JTAG Emulators" (Jul. 1, 1999).
EST Corp. (Canton, MA), "visionICE" (date not specified, but bears 1997–1999 copyright date ).
DSP Research, "In–Circuit JTAG Emulator for PCI Hosts" (date not specified, but bears 1999 copyright date).
IEEE Standard Test Access Port and Boundary–Scan Architecture, IEE Std. 1149.1–1990 (Includes IEEE Std 1149.1a–1993) (1993).

* cited by examiner

ADJUSTABLE VOLTAGE BOUNDARY SCAN ADAPTER FOR EMULATION AND TEST

FIELD OF THE INVENTION

The present invention relates to boundary scan interface logic on integrated circuits and how the defined signal levels are used. Specifically, the present invention relates to integrated circuits operating at low voltages with a boundary scan interface, and providing for the integrated circuit to be emulated, tested, interrogated, debugged, and programmed.

BACKGROUND OF THE INVENTION

The present invention relates to the type of integrated circuits which operate at a low voltage level. Typically, such integrated circuits are used in portable communications devices such as cellular telephones and hand held video games.

To reduce the cost of the customer's end product in high volume production, the integrated circuit with a boundary scan interface operates at a low voltage. The boundary scan interface may be, for example, a microprocessor, a gate array or Digital Signal Processor. A low voltage may be considered as 1.8 or 2.5 volts DC. Such an arrangement has no logic to interface to the boundary scan interface which operates at a higher voltage, such as for example, +5 volts DC.

If an existing boundary scan adapter were attached to the customer's end product, the boundary scan adapter and the customer's end product may be damaged because of the potential difference of +5 VDC, on one hand, and +1.8 or 2.5 VDC, on the other hand, between the two pieces of logic. For the engineer to develop the product safely, a two step process would have to take place. A prototype would need to be designed with special voltage logic for boundary scan emulation so the software algorithms for the integrated circuit could be debugged. And thereafter, the real end product must be designed without specialized voltage logic. Such a designing procedure means the "existing" boundary scan emulator cannot be used. This approach is time consuming and expensive. Two different products have to be developed, and the final product cannot be completely debugged and tested.

The referenced type of integrated circuits operate at a voltage lower than +3.3 or +5 volts DC, such as for example, 2.5 or 1.8 volts DC. These lower voltages used by the integrated circuit preclude the use of existing boundary scan adapters. Existing boundary scan adapters expect to interface with boundary scan logic operating at 3.3 or 5.0 volts DC. This means existing boundary scan adapters cannot be used to test, interrogate, debug software algorithms, and program non-volatile memories in the system.

It is, therefore, a feature of the present invention to provide an adjustable voltage boundary scan adapter, used for emulation and test, that can operate with integrated circuit boards having low voltages.

A feature of the present invention is to provide an adjustable voltage boundary scan adapter, when used for emulation and test, that does not require additional support circuitry around the integrated circuit.

Another feature of the present invention is to provide an adjustable voltage boundary scan adapter that can be have its interface logic voltage levels adjusted to match the voltage levels present on the integrated circuit.

Another feature of the present invention is to provide an adjustable voltage boundary scan adapter to allow low voltage integrated circuits with a boundary scan interface to be tested.

Another feature of the present invention is to provide an adjustable voltage boundary scan adapter to allow low voltage integrated circuits with a boundary scan interface to be interrogated.

Yet another feature of the invention is to provide an adjustable voltage boundary scan adapter to allow low voltage integrated circuits with a boundary scan interface to debug software algorithms.

Still another feature of the present invention is utilizing an adjustable voltage boundary scan adapter to allow low voltage integrated circuits with a boundary scan interface to program non-volatile memory in the system without special logic in the system.

Additional features and advantages of the invention will be set forth in part in the description which follows, and in part will become apparent from the description, or may be learned by practice of the invention. The features and advantages of the invention may be realized by means of the combinations and steps particularly pointed out in the appended claims.

SUMMARY OF THE INVENTION

To achieve the foregoing objects, features, and advantages and in accordance with the purpose of the invention as embodied and broadly described herein, an adjustable voltage boundary scan adapter that can be used for emulation and test is provided. The purpose of the adjustable voltage boundary scan adapter of the present invention is to allow low voltage integrated circuits with a boundary scan interface to be tested, interrogated, software algorithms debugged, and non-volatile memory in the system programmed without special logic in the system.

The adjustable voltage boundary scan adapter of the present invention allows the user to select the voltage level at which an integrated circuit boundary scan interface will operate. In one embodiment, this selection is done with a rotary selection switch on the adjustable voltage boundary scan adapter. Other embodiments could include making this selection with a potentiometer or physical jumper connection. The adjustable voltage boundary scan adapter has a programmable integrated circuit which reads the switch setting selections and adjusts its boundary scan signal levels accordingly.

In one embodiment, an apparatus for emulating, testing, interrogating, debugging, and programming an integrated circuit is provided comprising a boundary scan adapter and an interface associated with the integrated circuit. The boundary scan adapter is in association with a host computer for accepting a control signal from the host computer, and for generating an intermediate signal for acceptance by the integrated circuit. The intermediate signal is compliant with the specifications of the integrated circuit. The interface associated with the integrated circuit is for accepting the intermediate signal from the boundary scan adapter. The control signal from the host computer has a magnitude greater than the magnitude of the intermediate signal which intermediate signal is specific to and compliant with the operation of the integrated circuit.

In another embodiment, an apparatus for emulating, testing, interrogating, debugging, and programming an integrated circuit is provided comprising a host computer, a boundary scan adapter and an interface associated with the integrated circuit. The host computer generates a control signal for the apparatus. The boundary scan adapter is in association with the host computer for accepting the control signal from the host computer, and for generating an intermediate signal for acceptance by the integrated circuit. The intermediate signal is compliant with the specifications of the integrated circuit. The boundary scan adapter comprises a controller for accepting the control signal from the host computer and for generating a driver signal, the driver signal being at least one of equal to or not equal to the control signal, and a pin driver/receiver for receiving the driver signal from the controller and for generating an intermediate signal for acceptance by the integrated circuit which intermediate signal is compliant with the specifications of the integrated circuit. The interface associated with the integrated circuit accepts the intermediate signal from the boundary scan adapter. The control signal from the host computer has a magnitude greater than the magnitude of the intermediate signal which intermediate signal is specific to and compliant with the operation of the integrated circuit.

The following sequence is an example used by the adjustable voltage boundary scan adapter to determine the voltage at which to set its boundary scan signal levels.

1. When the cable from the adjustable voltage boundary scan adapter is plugged into a logic card resident in a personal computer and power is applied to the adjustable voltage boundary scan adapter, LEDs (light emitting diodes) will flash for a specified period of time.
2. A multi-position rotary switch is read by a microprocessor and the voltages are set per an appropriate table of values.
3. The presence/power detect (PD) signal is monitored until its voltage level exceeds the Power Detect Input Threshold. An LED under the control of a microprocessor will flash until this condition is met.
4. When the integrated circuit power is detected the JTAG outputs of the adjustable voltage boundary scan adapter will be enabled.
5. Once the JTAG outputs are enabled, the test-reset-input (TRST) line is monitored and the microprocessor will flash an LED until the TRST line is taken high by the software driver of the adapter in the personal computer. Once the TRST line is taken high, EMUO will be released from its Wait-In-Reset value and return to a tri-state condition. The LED will then turn off.
6. When target power is detected and TRST is high, and the LEDs will reflect the rotary switch setting.
7. The PD and TRST pins are monitored continuously. If either signal drops below its high threshold then the power detection sequence will start over at step #2.

BRIEF DESCRIPTION OF THE DRAWINGS

The accompanying drawings which are incorporated in and constitute a part of the specification, illustrate a preferred embodiment of the invention and together with the general description of the invention given above and the detailed description of the preferred embodiment given below, serve to explain the principles of the invention.

The above general description and the following detailed description are merely illustrative of the generic invention, and additional modes, advantages, and particulars of this invention will be readily suggested to those skilled in the art without departing from the spirit and scope of the invention.

DETAILED DESCRIPTION OF THE PREFERRED EMBODIMENTS

Reference will now be made in detail to the present preferred embodiments of the invention as described in the accompanying drawings.

The present invention relates to the boundary scan interface logic on integrated circuits defined in accordance with the IEEE 1149.1 standard and how the defined signal levels are used. With the boundary scan interface on the integrated circuit, a boundary scan adapter, and the appropriate software, the integrated circuit can be controlled. With this software controlling the boundary scan adaptor the integrated circuit can be emulated, tested, interrogated, software algorithms can be debugged, and non-volatile memory in the system can be programmed.

Figure 1A:
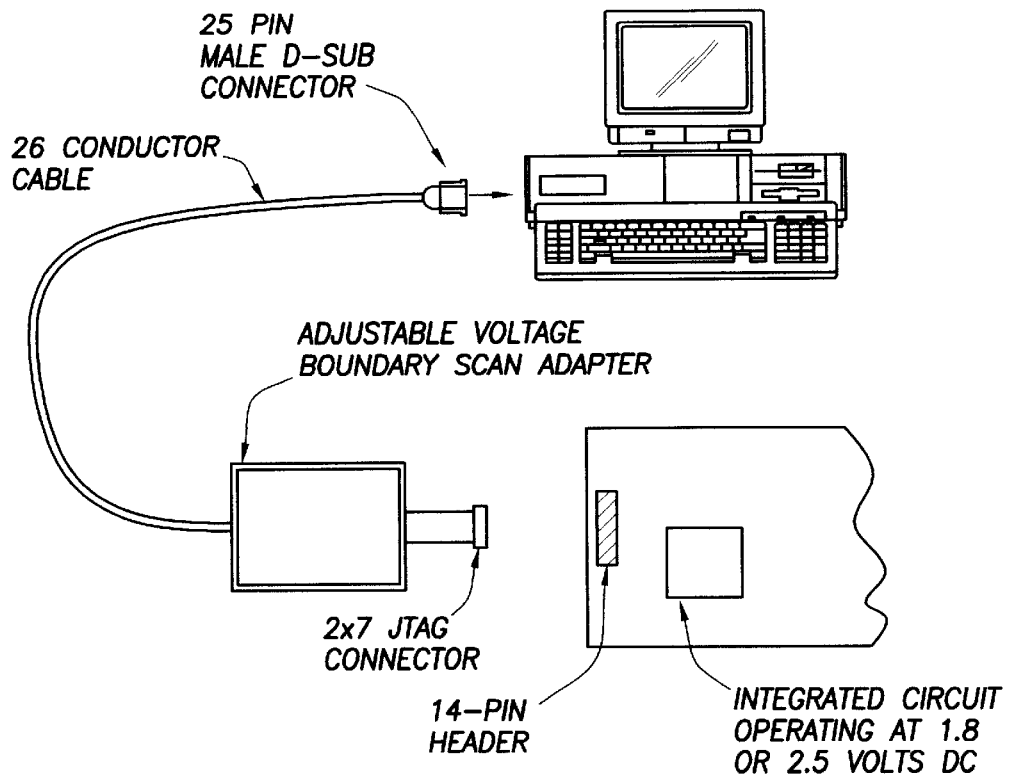
FIG. 1A is an illustration of the system of the present invention.

FIG. 1A is an illustration of the system 10 of the present invention. The system 10 comprises a host computer 12 with software connected to the boundary scan adapter 100 of the present invention. The boundary scan adapter 100 is connected to an integrated circuit 14. The host computer 12 is connected to the boundary scan adapter 100 by a conductor cable 16. The boundary scan adapter 100 is connected to the integrated circuit by a cable 18 and JTAG connector.

Figure 1B:
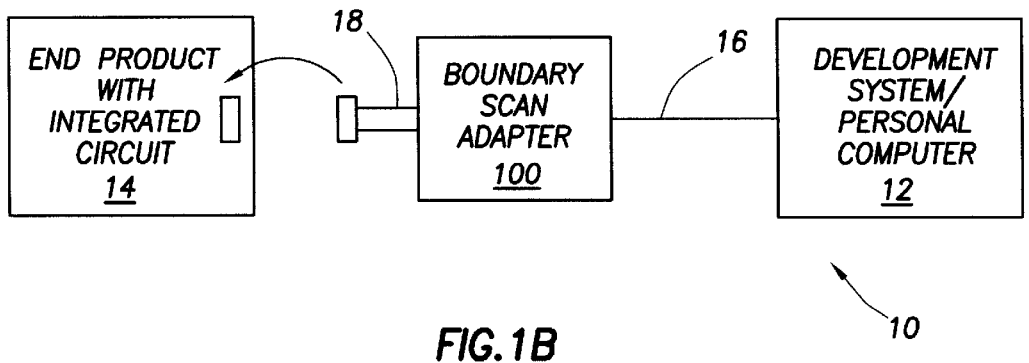
FIG. 1B is a block diagram of the system illustrated in FIG. 1A.

FIG. 1B is a block diagram of the system 10 illustrated in FIG. 1A. FIG. 1B illustrates the host computer 12 with software being connected via the conductor cable 16 to the boundary scan adapter 100. The boundary scan 100 is connected to the integrated circuit 14 via the JTAG connector 18.

Figure 1C:
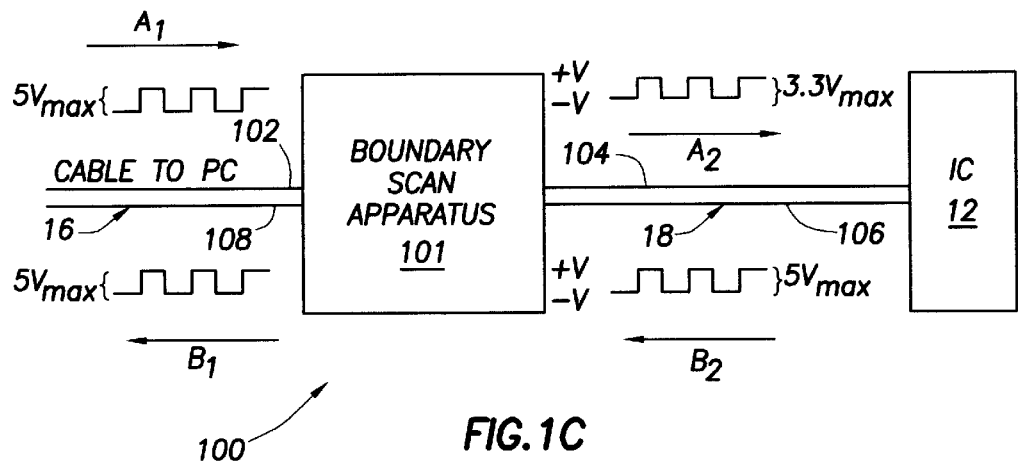
FIG. 1C is an illustration of the relationship of the boundary scan apparatus with the integrated circuit.

FIG. 1C is an illustration of the relationship of the boundary scan apparatus 100 with the integrated circuit 12. A cable 16 provides communication between the host computer (not shown) and the boundary scan apparatus 100. The cable 16 has an input line 102 from the host computer to the boundary scan apparatus 100, and an output line 108 from the boundary scan apparatus 100 to the host computer. Similarly, the conductor cable 18 provides communication between the boundary scan apparatus 100 and the integrated circuit 12. The conductor cable 18 has an input line 104 from the boundary scan apparatus 100 to the integrated circuit 12, and an output line 106 from the integrated circuit 12 to the boundary scan apparatus 100.

The signal $A_1$ is a data stream from the host computer to the boundary scan apparatus 100. Typical voltage levels for the data stream $A_1$ are from 0 to 5 volts, or TTL compatible. The data stream $B_1$ from the boundary scan apparatus 100 to the host computer is also typically between 0 and 5 volts, or TTL compatible. The data stream $A_2$ from the boundary scan apparatus 100 to the integrated circuit 12 is carried by the conductor 104 in the cable 18. The data stream $A_2$ has voltage levels that are variable. Also, the data stream $A_2$ is required not to exceed the specifications for the integrated circuit 12. Typically, the voltage levels required by the data stream $A_2$ in practicing the present invention are from 0 volts to a maximum of approximately 3.3 volts. Typically, the 0 volts is for the −V signal and the higher level voltage, for example the 3.3 volts, is for the +V signal. The digital data stream $B_2$ is provided as an output from the integrated circuit 12 to be accepted by the boundary scan apparatus 100. The digital data stream $B_2$ is carried by the conductor 106 of the cable 18. The voltage levels associated with the digital data stream $B_2$ are set and determined by the voltage requirements of the integrated circuit 12. The voltage levels for the digital data stream $B_2$ are generally between 0 volts and 5 volts. The 0 volt level is associated with the −V signal and the higher, for example 5 volt signal, is associated with the +V signal.

The boundary scan apparatus 100 provides a unique method of converting the digital data stream $A_1$ from the host computer to the apparatus 100 to a different voltage level, digital data stream $A_2$ for acceptance by a particular integrated circuit 12. Similarly, the adjustable voltage boundary scan adapter of the present invention provides a unique way of converting the voltage levels $B_2$ from the particular integrated circuit 12 to a voltage level $B_1$ which is usable by the host computer. Typically, the digital data streams between the host computer and the boundary scan apparatus 100 are fixed by the host computer. It is important to note that the digital data streams between the boundary scan apparatus 100 and the integrated circuit 12 are variable. The variable data streams $A_2$, $B_2$ are set by the integrated circuit 12 or "target" device. The digital data streams between the boundary scan apparatus 100 and the integrated circuit 12 are required at specific levels based on the technology of the integrated circuit 12.

Figure 2:
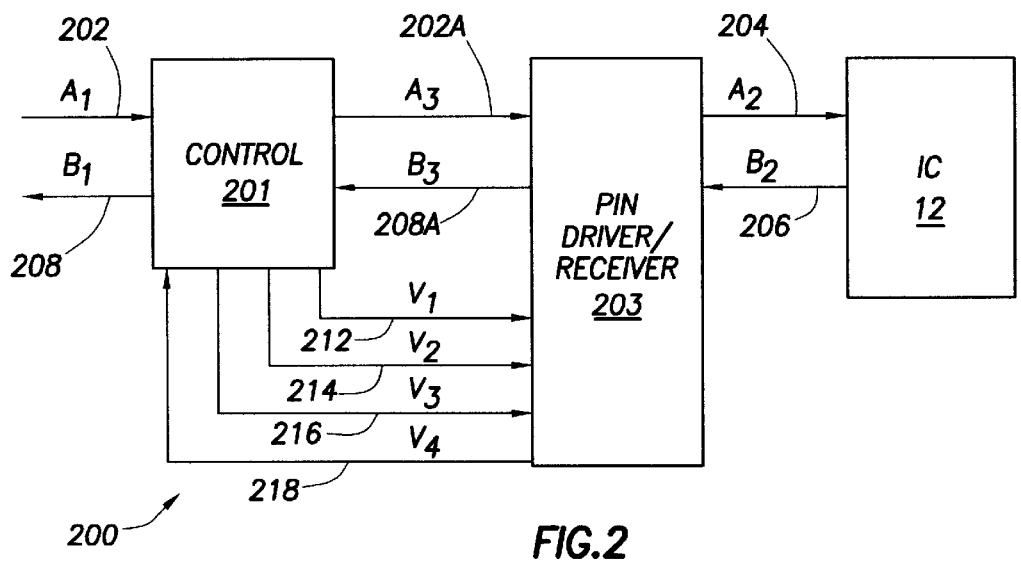
FIG. 2 is an illustration of another embodiment of the software development system of the present invention.

FIG. 2 is an illustration of another embodiment of a software development system 200 of the present invention. The software development system 200 comprises a master control block 201 and a pin driver/receiver 203. The signal $A_1$ is input through a line 202 into a master control 201. The signal $A_1$ is a digital data stream from the host computer. Typical voltages for data stream $A_1$ are from 0 to 5 volts, or TTL compatible. The digital data stream $B_1$ from the master control block 201 to the host computer is transferred along line 208. The digital data stream $B_1$ has typical voltages from 0 to 5 volts, or TTL compatible. The data stream from the master control block 201 to the pin driver/receiver 203 are implementation or application specific. The data stream $A_3$ may, or may not, be equal to $A_1$ or $A_2$. The data stream $B_3$ from the pin driver/receiver 203 to the master control block 201 is the converse signal of data stream $A_3$, but is in the reverse direction. Typically, the amplitude or levels of the data streams $A_3$ and $B_3$ are approximately the same. The data stream $A_2$ from the pin driver/receiver 203 to the integrated circuit 12 are variable and can not exceed the specifications for the integrated circuit 12. The levels of the data stream $A_2$ vary generally from 0 to approximately 3.3 volts for the −V value and the +V value, respectively. The digital data stream $B_2$ from the integrated circuit 12 to the pin driver/receiver 203 are variable and set by the voltage requirements of the integrated circuit 12. The levels of the data stream B2 are generally over the values of −V and up to 5 volts for the +V value.

The connections 212, 214, 216 and 218 provide specific control characteristics for the system 200 of the present invention. The voltage supply/level $V_1$ is for the signal output $A_2$. The voltage supply/level $V_1$ sets the voltage of $A_2$. The voltage threshold $V_2$ is for the signal input $B_2$ from the integrated circuit 12 to the pin driver/receiver 203. The voltage threshold $V_2$ sets the threshold voltage for the inputs $B_1$. The voltage threshold $V_3$ is for sensing the integrated circuit voltage level, $V_{cc}$. The voltage threshold $V_3$ can be used to determine when power is applied to the integrated circuit or for automatic sensing of the integrated circuit voltage level $V_{cc}$. The voltage feedback $V_4$ from the voltage supply level $V_1$, the voltage threshold $V_2$ and the voltage threshold $V_3$ is to provide a closed loop system.

The master control block 201 has various functions. The master control block 201 formats the data stream $A_1$ into an internal voltage level $A_3$ format. The data stream A, can be parallel, serial, or some higher level compound format. The data stream $A_3$ is a 1-to-1 representation of the data stream $A_2$, except for the internal voltage levels. Further, the master control block 201 provides a reverse function for the return data streams $B_1$, $B_2$, and $B_3$. The master control block 201 generates the appropriate voltage levels for the voltage supply/level $V_1$, the voltage threshold $V_2$ for the signal input $B_2$, and the voltage threshold $V_3$ for the sensing of the integrated circuit voltage level. Also, the master control block 201 uses the feedback voltage $V_4$ to create a closed loop system. The closed loop system protects from over-voltage or under-voltage conditions at the integrated circuit 12. Control implementation from the host computer, user or other input device is provided to the master control block 201. The master control block 201 uses the information from the host computer, user or other input device to offset voltage discrepancies at the voltage supply/level $V_1$, the voltage threshold $V_2$ or the voltage threshold $V_3$.

The pin driver/receiver 203 also has several functions. The pin driver/receiver 203 converts the data stream $A_3$ from an internal fixed voltage level to the voltage level of the integrated circuit 12 based on the voltage supply/level $V_1$. Also, the pin driver/receiver 203 converts the data stream $B_2$ from the integrated circuit voltage level to the data stream $B_3$ voltage level based on the threshold voltage $V_2$. The pin driver/receiver 203 generates a target power on/off indicator based on the threshold voltage $V_3$. Further, the pin driver/receiver 203 creates the feedback information $V_4$ on the line 218 based upon the voltages $V_1$, $V_2$, and $V_3$ and the data streams $A_2$ and $B_2$.

Figure 3A:
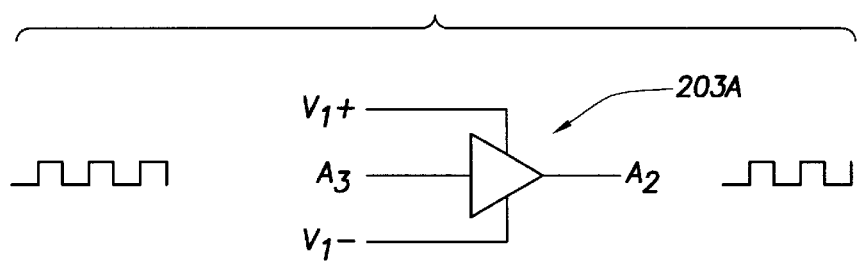
FIG. 3A is an illustration of one embodiment of a generic pin driver/receiver.

FIG. 3A is an illustration of a generic pin driver/receiver 203A. The generic pin driver/receiver 203A has a data stream $A_3$ as an input signal source. The resulting output driver signal $A_2$ is created. A voltage source $V_1+$ sets the upper voltage level of $A_2$ which can be indicated as $A_{2(VOH)}$. The voltage level $V_1-$ sets the lower voltage level of $A_2$ or $A_{2(VOL)}$. By adjusting the voltage levels $V_1+$, $V_1-$, the resulting $A_2$ can swing between the voltage levels $V_1+$, and $V_1-$.

Figure 3B:
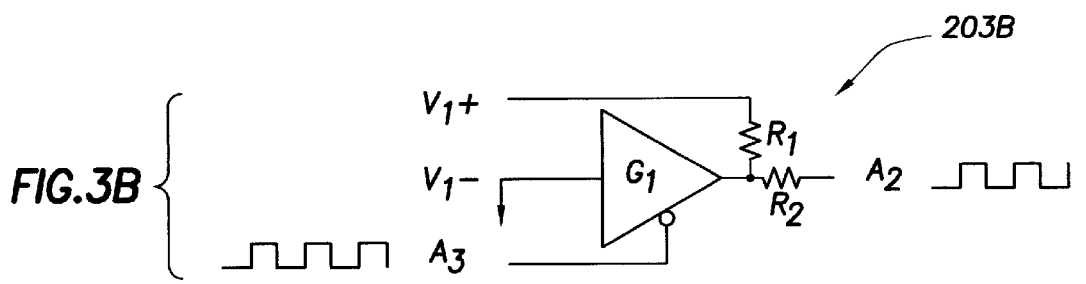
FIG. 3B is an illustration of another embodiment of a pin driver/receiver.

FIG. 3B is an illustration of an inexpensive pin driver/receiver 203B using off-the-shelf components. The voltage $V_1-$ is set to 0 volts. The voltage $V_1+$ is programmed to match the input voltage requirements of the integrated circuit 12 or data stream $A_2$. Thus, the signal $A_3$ drives the enable pin of the gate $G_1$. When $A_3$ is high, the gate $G_1$ is "off" and the voltage level $A_2$ is equal to the voltage $V_1+$. When $A_3$ is low, the gate $G_1$ is "on" and the voltage $A_2$ is equal to the voltage $V_1-$. The resister $R_1$ provides a current limit for the voltage $V_1+$. The value of the resistor $R_1$ is chosen to match the requirements of the gate $G_1$. The resistor $R_2$ is optional. The resistor $R_2$ can be used to affect the impedance of the data stream or signal $A_2$. The simplicity and cost of the pin driver/receiver 203B is an important feature. At current prices, variable voltage is available for most common integrated circuit families whose levels range from 1.0 to 5.0 volts for about 15 cents per output pin. The value of $V_1+$ may also have infinite adjustments within this range.

Figure 4A:
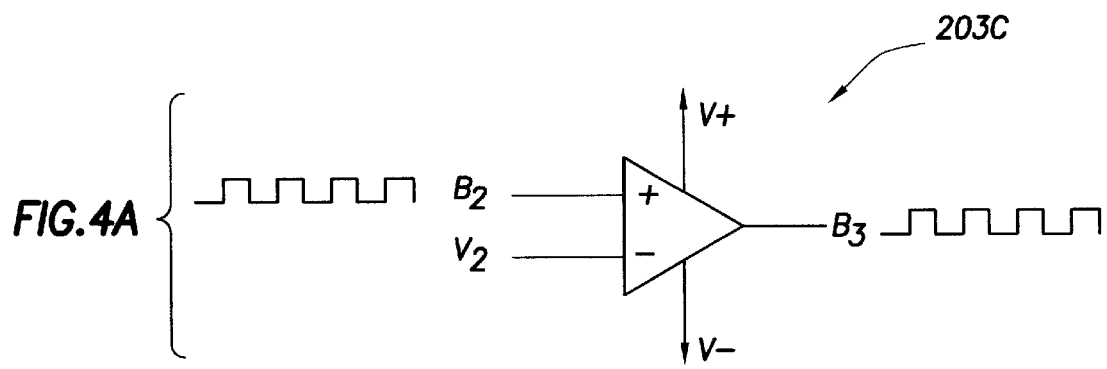
FIG. 4A illustrates a generic pin receiver.

FIG. 4A illustrates a generic pin receiver 203C. The generic pin receiver 203C has the data stream $B_2$ input from the integrated circuit 12 or target. The voltage $V_2$ sets the output/input switch threshold of $B_2$. The data stream $B_3$ is the resulting signal. The signal $B_3$ has a level that matches that of the master control block 201. The logic "0/1" state of the signal $B_2$ is set by the voltage applied to $V_2$. When the level of $B_2$ exceeds the level of $V_2$, then $B_2$ is considered a "1" and the corresponding level of $B_3$ is set to "1." When the level of $B_2$ falls below $V_2$, then $B_2$ is considered a "0" and the corresponding level of $B_3$ is set to "0." The voltage associated with the V+/V− relationship sets the overall range of $B_2$ and $B_3$. By controlling the voltage of $V_2$, the "0/1" level of $B_2$ can be varied. The level of $B_2$ is independent of the $A_2$ levels. Thus, the voltage $V_2$ may be set above or below $B_2$ associated with the integrated circuit 12. The typical "0/1" level is set to provide additional noise immunity in a noisy or lossy environment.

Figure 4B:
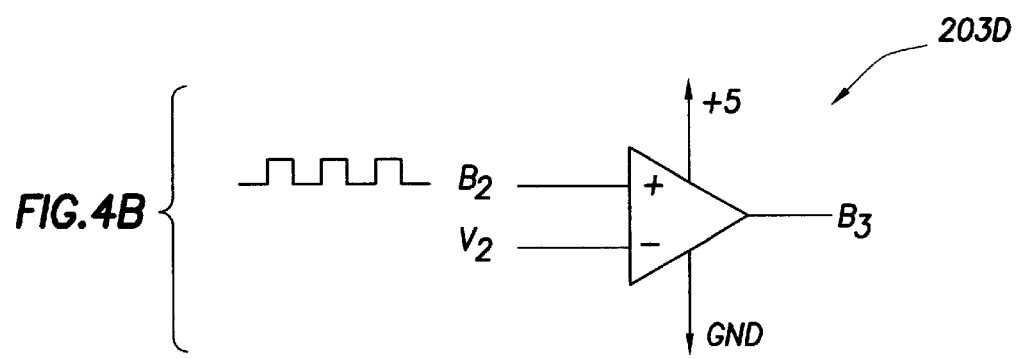
FIG. 4B is another embodiment of a pin receiver.

FIG. 4B is a specific implementation of a pin receiver 203D. Such a specific embodiment provides that the voltage V+ is equal to +5 volts and the voltage V− is equal to 0. The embodiment with the pin receiver 203D provides for a $B_2$ range of 0 to 5 volts.

Figure 4C:
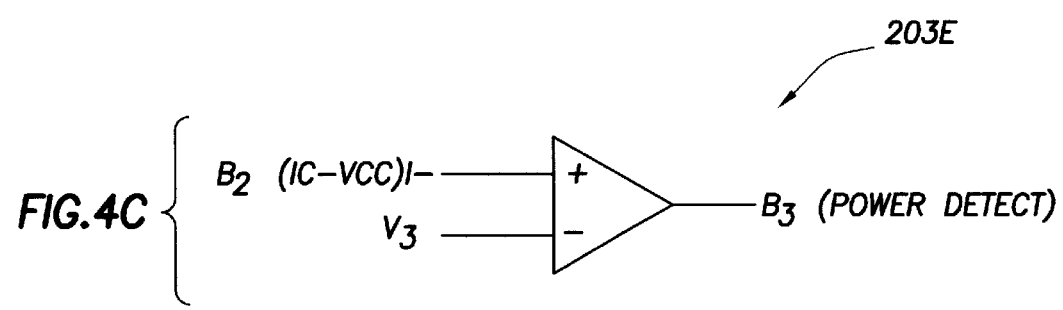
FIG. 4C is yet another embodiment of a pin receiver.

FIG. 4C illustrates yet another embodiment of a pin receiver 203E. The pin receiver 203E provides an integrated circuit power detect device. By setting the value of voltage $V_3$, the present invention can detect when the integrated circuit 12 is "on," "off," or in a "brown out" condition. Such condition information is generally necessary as feedback to control the signals $A_3$, $B_3$, $V_1$, $V_2$, and $A_2$. For example, the most obvious control would be to "disable" output drivers $A_2$ in the case of an integrated circuit "off" or "brown out" condition. Such control would help prevent latch up of voltage back driving into the integrated circuit.

Figure 5:
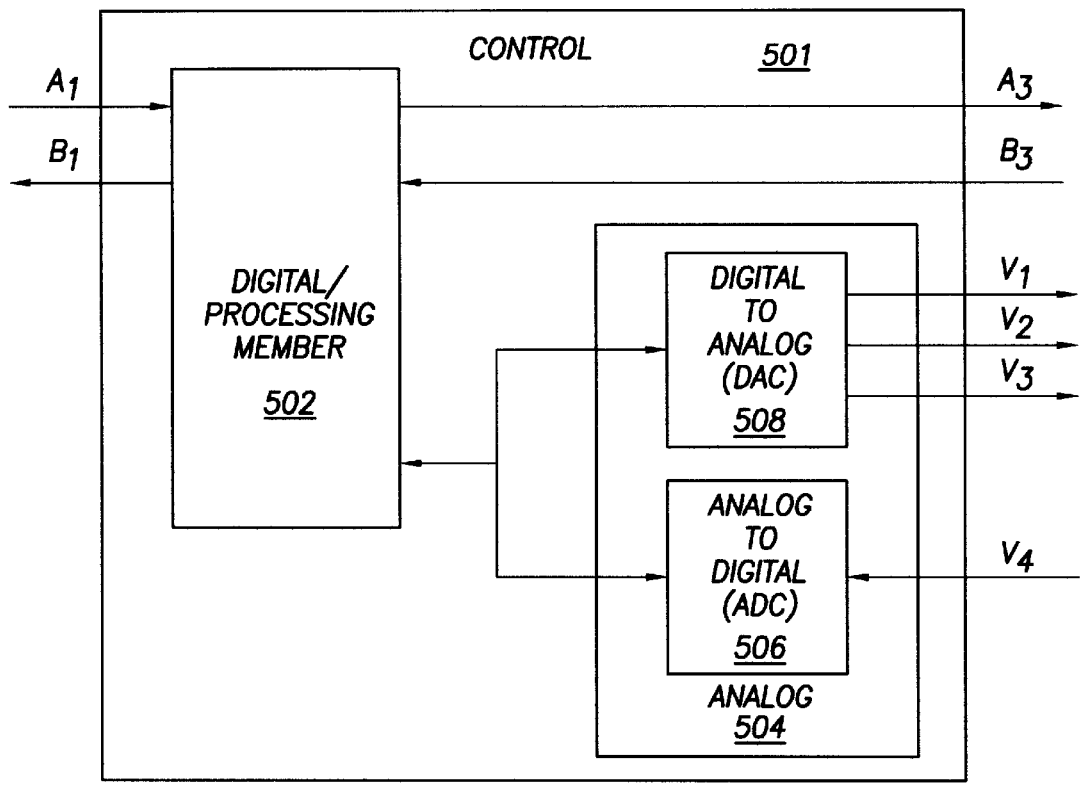
FIG. 5 is another embodiment of a master control block.

FIG. 5 is another embodiment of a master control block 501. The master control block 501 comprises a digital processing member 502 and an analog member 504. The analog member 504 comprises a digital to analog converter 508 and an analog to digital converter 506.

The digital processing member 502 sends CMDS/data to the digital-to-analog converter 508 to generate the necessary voltage levels on $V_1$, $V_2$, $V_3$. Also, the digital processing member 502 reads the levels on the $V_4$ inputs as digital data. The $V_4$ inputs represent the feedback path for $V_1$, $V_2$, $V_3$, A and $B_3$.

The digital processing member 502 provides overall control for the apparatus of the present invention. The digital processing member may be as simple as a bank of switches or as complicated as a full micro-processor/micro-computer control.

Figure 6:
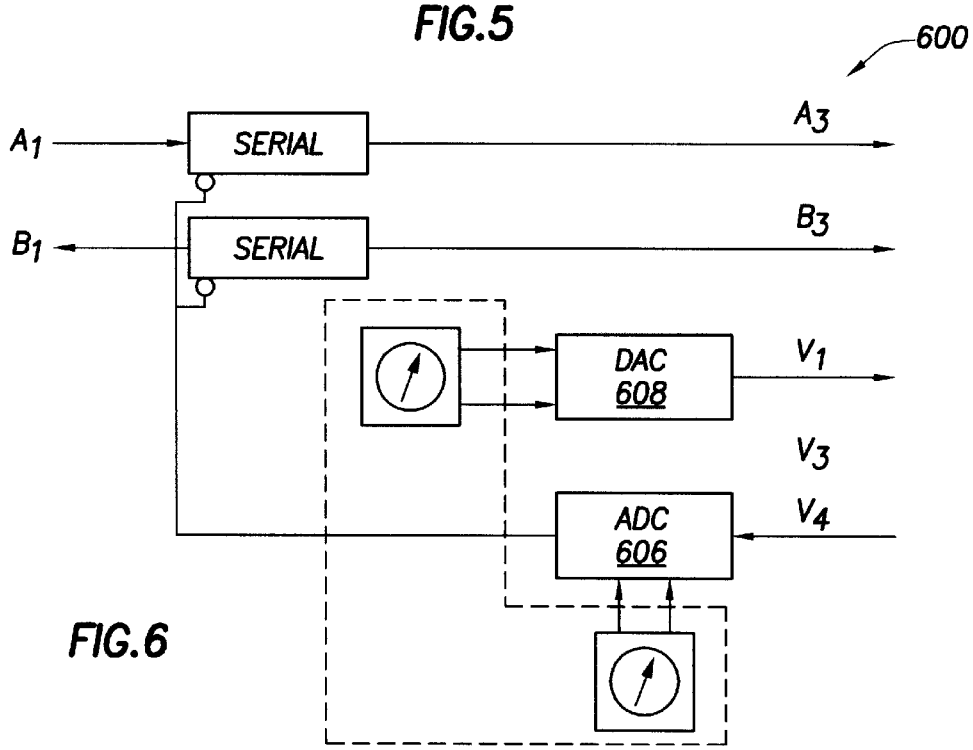
FIG. 6 illustrate still another embodiment of the master control block.

FIG. 6 illustrates another embodiment of the master control block 600. In a simple serial stream from the host computer, signal $A_1$ passes through to signal $A_3$. Similarly, the signal $B_3$ passes through to signal $B_1$. Thus, the data-in value is equal to the data-out value. No data value formatting is required. The $V_1$–$V_3$ voltage levels are set by values on the digital to analog converter 608. Alternately, the $V_1$–$V_3$ voltage levels may be set by a device as simple as a resistor network. The voltage level $V_4$ may only represent the presence or the absence of power on the integrated circuit. In the event of no power on the integrated circuit, the $A_2/B_1$ signal may be driven to "0" volts for safety reasons.

Figure 7:
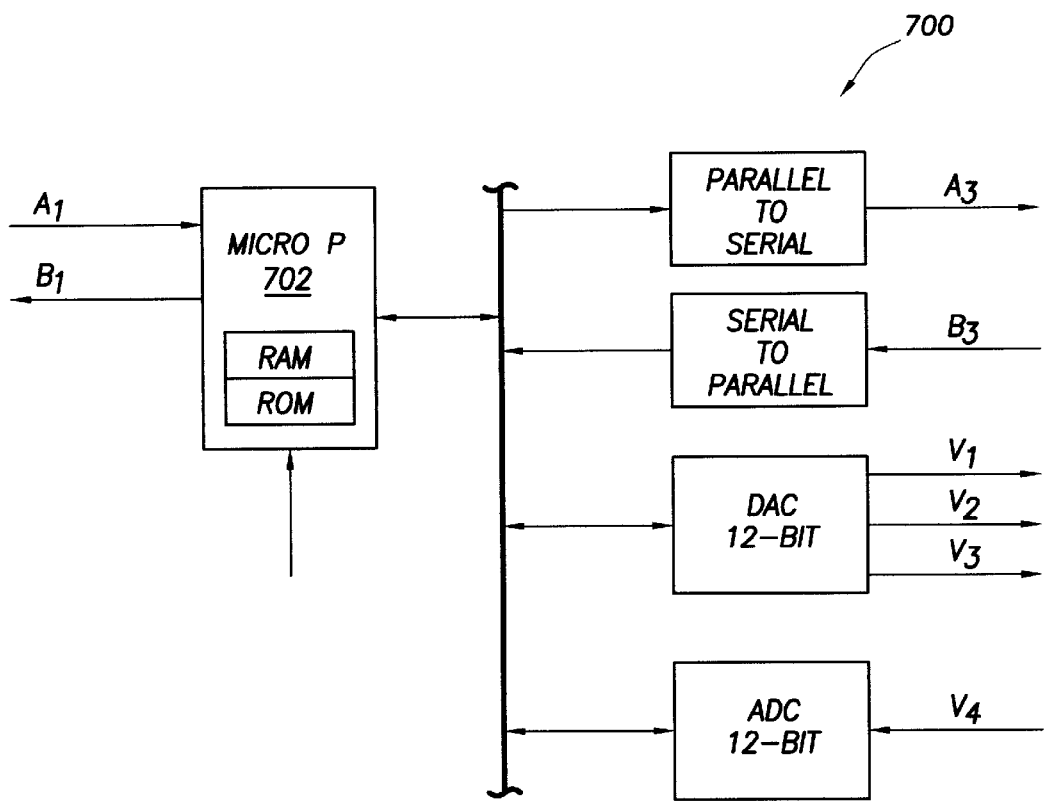
FIG. 7 illustrates a more complex version of the embodiment of the present invention.

FIG. 7 illustrates a more complex version of an embodiment of an adjustable voltage boundary scan adapter of the present invention. The signals $A_1$, $B_1$ present high level commands and data. The micro-processor 702 processes the commands and data. The result of the processing of the micro-processor 702 may be sent or transferred in a particular test or emulation sequence to the integrated circuit 12. Alternately, the result of the micro-processor 702 may be to adjust the voltage level of $V_1$, $V_2$, $V_3$. When utilizing the micro-processor 702, the actions on the feedback path can become complex. For example, all the leads $V_1$, $V_2$, $V_3$ may be determined by voltage levels on the integrated circuit supply. If the integrated circuit power turns "off" or "browns out," the micro-processor 702 may respond by setting all the digital to analog converter outputs to "0" volts. The addition of a micro-processor 702 creates an overall smarter system with respect to the present invention. For instance, the voltage levels can be finely tuned to compensate for noise, drift, lossy lines, etc. Micro-processor 702 also enables the present invention to implement actions based on integrated circuit events or internal events. Typical micro-processor actions which are available when using the present invention are to set $V_1$, $V_2$, $V_3$ based on integrated circuit power supply requirements; continually monitoring the integrated circuit power level looking for a loss of integrated circuit power; with respect to integrated circuit power loss, reprogramming the digital to analog converters to levels which protect the integrated circuit from damage; setting levels on $V_1$, $V_2$, $V_3$ independent of integrated circuit power such that the integrated circuit power seen by the boundary scan apparatus of the present invention may not represent the true integrated circuit power; and making adjustments in $V_1$, $V_2$, $V_3$ over time if drift compensation is required.

Figure 8:
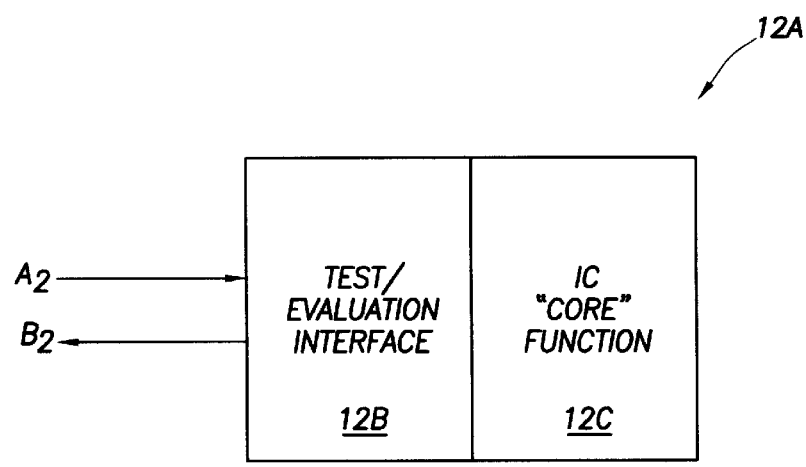
FIG. 8 illustrates yet another embodiment of the present invention.

FIG. 8 illustrates yet another embodiment of the present invention. With a modified integrated circuit 12A. The modified integrated circuit 12A has a test emulation interface 12B and an integrated "core" function 12C. The integrated circuit 12A has an integrated circuit as simple as an SSI logic gate or as complex as a RISC or DSP processor. As changes in integrated circuit technology occur, the integrated circuits will operate at lower and lower voltages. Today, typical integrated circuits have 5 volt, 3.3 volt and 2.5 volt input output interfaces. Future devices will continue to reduce the voltage of the input output interfaces. It is expected that future devices will reduce the input output interfaces of the integrated circuits to 1.8 volts, 1.5 volts and 1.0 volts. With such a wide variety of voltage interfaces, a test/emulation interface is required to support the full range of interface voltages.

Additional advantages and modification will readily occur to those skilled in the art. The invention in its broader aspects is therefore not limited to the specific details, representative apparatus, and the illustrative examples shown and described herein. Accordingly, the departures may be made from the details without departing from the spirit or scope of the disclosed general inventive concept.

What is claimed is:

1. An apparatus for emulating, testing, interrogating, debugging, and/or programming an integrated circuit comprising:

(a) an input device for generating a control signal;

(b) a boundary scan adapter in association with said input device comprising:

(1) a controller for accepting the control signal from said input device and for generating a driver signal, the driver signal being at least one of equal to or not equal to the control signal, wherein the controller comprises:
  (i) a digital processing member,
  (ii) a digital-to-analog converter, and
  (iii) an analog-to-digital converter,
(2) a pin/driver receiver for receiving the driver signal from the controller and for generating an intermediate signal that is compliant with the specifications of the integrated circuit; and
(c) an interface associated with the integrated circuit for accepting the intermediate signal from said boundary scan adapter.

2. The apparatus as defined in claim 1 wherein said pin driver/receiver comprises means for controlling an output from said pin driver/receiver for maintaining the output between predetermined voltage levels.

3. The apparatus as defined in claim 1 wherein said pin driver/receiver comprises a gate for controlling an output from said pin/driver receiver for maintaining the output between predetermined voltage levels.

4. The apparatus of claim 1 wherein said input device comprises a host computer.

5. An apparatus for emulating, testing, interrogating, debugging, and/or programming an integrated circuit comprising:
(a) a boundary scan adapter for accepting a control signal from an input device comprising:
  (1) a controller for accepting the control signal from the input device and for generating a driver signal, the driver signal being at least one of equal to or not equal to the control signal, wherein the controller comprises:
    (i) a digital processing member,
    (ii) a digital-to-analog converter, and
    (iii) an analog-to-digital converter,
  (2) a pin driver/receiver for receiving the driver signal from the controller and for generating an intermediate signal for acceptance by the integrated circuit which intermediate signal is compliant with the specifications of the integrated circuit; and
(b) an interface associated with the integrated circuit for accepting the intermediate signal from said boundary scan adapter, the control signal from the input device having a magnitude greater than the magnitude of the intermediate signal.

6. The apparatus as defined in claim 5 wherein said pin driver/receiver comprises means for controlling an output from said pin driver/receiver for maintaining the output between predetermined voltage levels.

7. The apparatus as defined in claim 5 wherein the pin driver/receiver comprises a gate for controlling an output from said pin driver/receiver for controlling an output from said pin driver/receiver for maintaining the output between between predetermined voltage levels.

8. The apparatus of claim 5 wherein said input device comprises a host computer.

9. A controller for driving a pin driver/receiver in a boundary scan adapter, the boundary scan adapter being connectable to an input device, for emulating, testing, interrogating, debugging, and/or programming an integrated circuit comprising:
a digital processing member for at least one of:
  (a) selecting voltage levels to operate with an integrated circuit boundary scan interface, or
  (b) providing a reverse function for the return data streams from an integrated circuit boundary scan interface, and
an analog member comprising:
  (a) a digital-to-analog converter for generating the selected voltage levels to operate with an integrated circuit boundary scan interface, and
  (b) an analog-to-digital converter for at least one of:
    (1) reading the voltage levels generated, or
    (2) providing feedback of the generated voltage levels.

10. The apparatus of claim 9 wherein said digital processing member further comprises means for selecting a voltage threshold for sensing the voltage level of the integrated circuit boundary scan interface.

11. The apparatus of claim 10 wherein said digital processing member further comprises means for monitoring the voltage level of the integrated circuit boundary scan interface.

12. The apparatus of claim 11 wherein said digital processing member further comprises means for adjusting voltage levels based on the voltage level of the integrated circuit boundary scan interface.

13. The apparatus of claim 11 wherein said digital processing member further comprises means for adjusting the voltage levels to protect the integrated circuit boundary scan interface from damage in the event of power loss.

14. The apparatus of claim 9 wherein said digital processing member further comprises means for adjusting voltage levels based on commands from an input device.

15. The apparatus of claim 9 wherein said digital processing member further comprises means for at least one of:
  (a) selecting a voltage threshold for the return data streams from the integrated circuit boundary scan interface, or
  (b) adjusting the voltage threshold to provide additional noise immunity in a noisy, lossy, or drift environment.

16. The apparatus of claim 9 wherein the feedback creates a closed loop system for protection from over-voltage and/or under-voltage conditions at the integrated circuit boundary scan interface.

17. The apparatus of claim 9 wherein the digital processing member further comprises a means for monitoring feedback of the generated voltage levels.

18. The apparatus of claim 9 wherein said input device comprises a host computer.

19. An apparatus for emulating, testing, interrogating, debugging, and/or programming an integrated circuit an integrated circuit boundary scan interface comprising digital and analog means for converting a digital data stream from an input device to a variable voltage level for acceptance by an integrated circuit including means for selecting a voltage threshold for sensing the voltage level of the integrated circuit boundary scan interface and for converting the return data stream from the integrated circuit to a voltage level usable by the input device.

20. The apparatus of claim 19 wherein said data converting means further comprises means for monitoring the voltage level of the integrated circuit boundary scan interface.

21. The apparatus of claim 20 wherein said data converting means further comprises means for adjusting voltage levels based on the voltage level of the integrated circuit boundary scan interface.

22. The apparatus of claim 20 wherein the data converting means further comprises means for adjusting the voltage levels to protect the integrated circuit boundary scan interface from damage in the event of power loss.

23. The apparatus of claim 19 wherein the data converting means further comprises means for adjusting voltage levels based on commands from an input device.

24. The apparatus of claim 19 wherein said data converting means further comprises means for at least one of:
   (a) selecting a voltage threshold for the return data streams from the integrated circuit boundary scan interface, or
   (b) adjusting said voltage threshold to provide additional noise immunity in a noisy, lossy, or drift environment.

25. The apparatus of claim 19 wherein said analog means comprises an analog-to-digital converter and a digital-to-analog converter.

26. The apparatus of claim 19 wherein said input device comprises a host computer.

27. A method of emulating, testing, interrogating, debugging and/or programming an integrated circuit with a controller interacting with a pin driver/receiver in a boundary scan adapter connectable to an input device comprising the steps of:
   (a) accepting a control signal from an input device;
   (b) adjusting interface logic levels with a digital processing member and an analog member to match the voltage requirements of a particular integrated circuit boundary scan interface; and
   (c) converting the return data stream from the integrated circuit to a voltage level usable by the input device.

28. The method of claim 27 additionally comprising sensing the voltage level of the integrated circuit boundary scan interface.

29. The method of claim 28 additionally comprising monitoring the integrated circuit boundary scan interface for power loss.

30. The method of claim 27 additionally comprising monitoring feedback of the interface logic levels.

31. The method of claim 27 additionally comprising compensating voltage levels for one or more of noise, drift, or lossy lines.

32. The method of claim 27 wherein the input device is a host computer.

33. The method of claim 27 additionally comprising reprogramming the digital processing member to interface logic levels which protect the integrated circuit from damage.

* * * * *